United States Patent
Nie et al.

(10) Patent No.: US 10,823,683 B1
(45) Date of Patent: Nov. 3, 2020

(54) METHOD FOR DETECTING DEFECTS IN DEEP FEATURES WITH LASER ENHANCED ELECTRON TUNNELING EFFECT

(71) Applicant: Yangtze Memory Technologies Co., Ltd., Wuhan, Hubei Province (CN)

(72) Inventors: Sheng Chao Nie, Wuhan (CN); Jin Xing Chen, Wuhan (CN); Junqi Ren, Wuhan (CN)

(73) Assignee: Yangtze Memory Technologies Co., Ltd., Wuhan, Hubei Province (CN)

( * ) Notice: Subject to any disclaimer, the term of this patent is extended or adjusted under 35 U.S.C. 154(b) by 0 days.

(21) Appl. No.: 16/684,602

(22) Filed: Nov. 15, 2019

Related U.S. Application Data

(63) Continuation of application No. PCT/CN2019/110705, filed on Oct. 12, 2019.

(51) Int. Cl.
| | | |
|---|---|---|
| *G01N 23/00* | (2006.01) | |
| *H01L 21/66* | (2006.01) | |
| *G01N 21/95* | (2006.01) | |
| *G06T 7/00* | (2017.01) | |
| *H01L 21/761* | (2006.01) | |

(52) U.S. Cl.
CPC ....... *G01N 21/9505* (2013.01); *G06T 7/0004* (2013.01); *H01L 21/761* (2013.01); *G06T 2207/30148* (2013.01)

(58) Field of Classification Search
CPC ............... H01L 22/12; H01L 22/24; H01J 2237/24564; H01J 2237/24592; H01J 37/26; H01J 37/28; H01J 2237/2594; H01J 2237/2803; H01J 37/226; H01J 37/263; G01N 21/9501; G01N 2223/611; G01N 2223/6116; G01N 23/2206; G01N 23/2251
USPC ............ 250/306, 307, 311; 382/149; 438/14
See application file for complete search history.

(56) References Cited

U.S. PATENT DOCUMENTS

| | | | |
|---|---|---|---|
| 2002/0043628 A1 | 4/2002 | Kim | |
| 2003/0001598 A1 | 1/2003 | Weiner | |
| 2007/0036421 A1 | 2/2007 | Toba | |
| 2008/0265251 A1* | 10/2008 | Xiao | ........ H01L 22/12 257/48 |
| 2009/0102501 A1 | 4/2009 | Guldi | |

(Continued)

FOREIGN PATENT DOCUMENTS

| | | |
|---|---|---|
| TW | 200629454 | 8/2006 |
| TW | 200937550 | 9/2009 |

*Primary Examiner* — David A Vanore
(74) *Attorney, Agent, or Firm* — Winston Hsu

(57) ABSTRACT

A method for detecting defects in deep features like channel holes, via holes or trenches based on laser-enhanced electron tunneling effect. A substrate having thereon a film stack is provided. First and second deep features are formed in the film stack. The first deep feature has a sacrificial oxide layer disposed at its bottom. The second deep feature comprises an under-etch defect. The sacrificial oxide layer has a thickness of less than 50 angstroms. The substrate is subjected to a laser-enhanced electron beam inspection process. The substrate is scanned by an electron beam and illuminated by a laser beam. The laser beam induces electron tunneling across the sacrificial protection layer, thereby capturing a bright voltage contrast (BVC) signal corresponding to the first deep feature, and detecting a dark voltage contrast (DVC) signal corresponding to the second deep feature.

10 Claims, 3 Drawing Sheets

(56) References Cited

U.S. PATENT DOCUMENTS

| | | | |
|---|---|---|---|
| 2010/0078554 A1* | 4/2010 | Xiao | H01J 37/26 |
| | | | 250/307 |
| 2010/0279436 A1* | 11/2010 | Fu | H01L 22/12 |
| | | | 438/14 |
| 2010/0314539 A1* | 12/2010 | Xiao | H01J 37/1474 |
| | | | 250/307 |
| 2010/0320381 A1* | 12/2010 | Zhao | H01J 37/28 |
| | | | 250/307 |
| 2011/0013826 A1* | 1/2011 | Xiao | G01R 31/307 |
| | | | 382/149 |
| 2011/0032348 A1* | 2/2011 | Lim | G06T 7/0006 |
| | | | 348/87 |
| 2011/0036981 A1* | 2/2011 | Zhao | G01N 23/2206 |
| | | | 250/307 |
| 2017/0032929 A1* | 2/2017 | Lei | H01L 22/20 |
| 2017/0192050 A1* | 7/2017 | Lei | G01R 31/2812 |

* cited by examiner

METHOD FOR DETECTING DEFECTS IN DEEP FEATURES WITH LASER ENHANCED ELECTRON TUNNELING EFFECT

CROSS REFERENCE TO RELATED APPLICATIONS

The present patent application is a continuation of PCT application Ser. No. PCT/CN2019/110705, filed Oct. 12, 2019, designating the United States, which is hereby incorporated by reference.

BACKGROUND OF THE INVENTION

1. Field of the Invention

The present disclosure relates to a defect inspection method. More particularly, the present disclosure relates to a method for detecting defects in deep features (e.g. channel holes, via holes or slit trenches) based on laser-enhanced electron tunneling effect.

2. Description of the Prior Art

In the manufacture of semiconductor devices, patterned substrates are inspected for defects so that the production of acceptable devices can be achieved. Various inspection technologies have been developed to capture defects on a patterned substrate. A common inspection technology is electron beam inspection (EBI).

EBI is performed by scanning an electron beam over surface patterns of devices formed on a substrate, and collecting the secondary electrons emanated from the surface patterns of scanned devices as inspection signals. The signals are processed and represented in grey levels to produce images of surface patterns of the scanned devices.

During the 3D NAND memory manufacturing processes, as the number of layers of the film stack increases, the ability of the etching equipment becomes more and more difficult to meet the requirements of one-time etching, and the 3D NAND multi-stack technology has emerged. Multi-stack technology requires the sacrificial layer (e.g. Silicon Oxide, Carbon, to name a few) to protect the lower-stack substrate when manufacturing the upper film stack.

However, the conventional EBI tool is neither able to detect nor to distinguish the under-etch defects of the lower-stack substrate because of the existence of the sacrificial layer which covers the lower-stack substrate without letting pass through of electrons. Therefore, there is a strong need in this industry to provide an improved defect inspection approach such that the effective detection of the under-etch defects of the lower stack can be realized, and the online defects or problems can be monitored in time.

SUMMARY OF THE INVENTION

It is one object of the present disclosure to provide an improved in-line defect inspection method that is capable of detecting under-etch defects in deep features (e.g. channel holes, via holes or slit trenches, etc.).

According to one aspect of the present disclosure, a defect inspection method is disclosed. A substrate having thereon a film stack is provided. A first deep feature and a second deep feature are formed in the film stack. The first deep feature comprises a sacrificial protection layer at its bottom. The second deep feature comprises an under-etch defect. The substrate is subjected to a laser-enhanced electron beam inspection process.

The substrate is scanned by an electron beam and illuminated by a laser beam. The laser beam induces electron tunneling through the sacrificial protection layer during the laser-enhanced electron beam inspection process, thereby capturing a bright voltage contrast (BVC) signal corresponding to the first deep feature, and detecting a dark voltage contrast (DVC) signal corresponding to the second deep feature.

According to some embodiments, the sacrificial protection layer may be a silicon oxide layer and has a thickness ranging between 5 angstroms and 100 angstroms.

According to some embodiments, the substrate is a semiconductor substrate.

According to some embodiments, the first deep feature and the second deep feature are hollow, penetrating through the film stack.

According to some embodiments, the film stack comprises multiple layers of alternating dielectric layer (e.g. Silicon Oxide, Silicon Nitride, Silicon Carbide, Silicon Oxynitride, etc.) and conductor layer (e.g. doped poly-Si, metal layers of W, Co, Cu, etc.), or alternating dielectric layer (e.g. Silicon Oxide, Silicon Carbide, etc.) and gateline replacement sacrificial layer (e.g. Silicon Nitride, Silicon Oxynitride, etc.).

According to some embodiments, the first deep feature comprises one end portion extending perpendicular to a major surface of the substrate, and wherein the end portion comprises a silicon layer and the sacrificial protection layer capping the epitaxial silicon layer.

According to some embodiments, in each of the first and second deep features, a sacrificial layer (e.g. Poly-Si, carbon, etc.) is deposited, and wherein the first and second deep features are not completely filled with the sacrificial layer and a void is formed in each of the first and second deep features.

According to some embodiments, the sacrificial protection layer insulates the epitaxial silicon layer from the sacrificial layer.

According to some embodiments, the laser beam has energy that is higher than band gap of silicon.

According to some embodiments, the laser beam has energy of about 2.0 eV.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
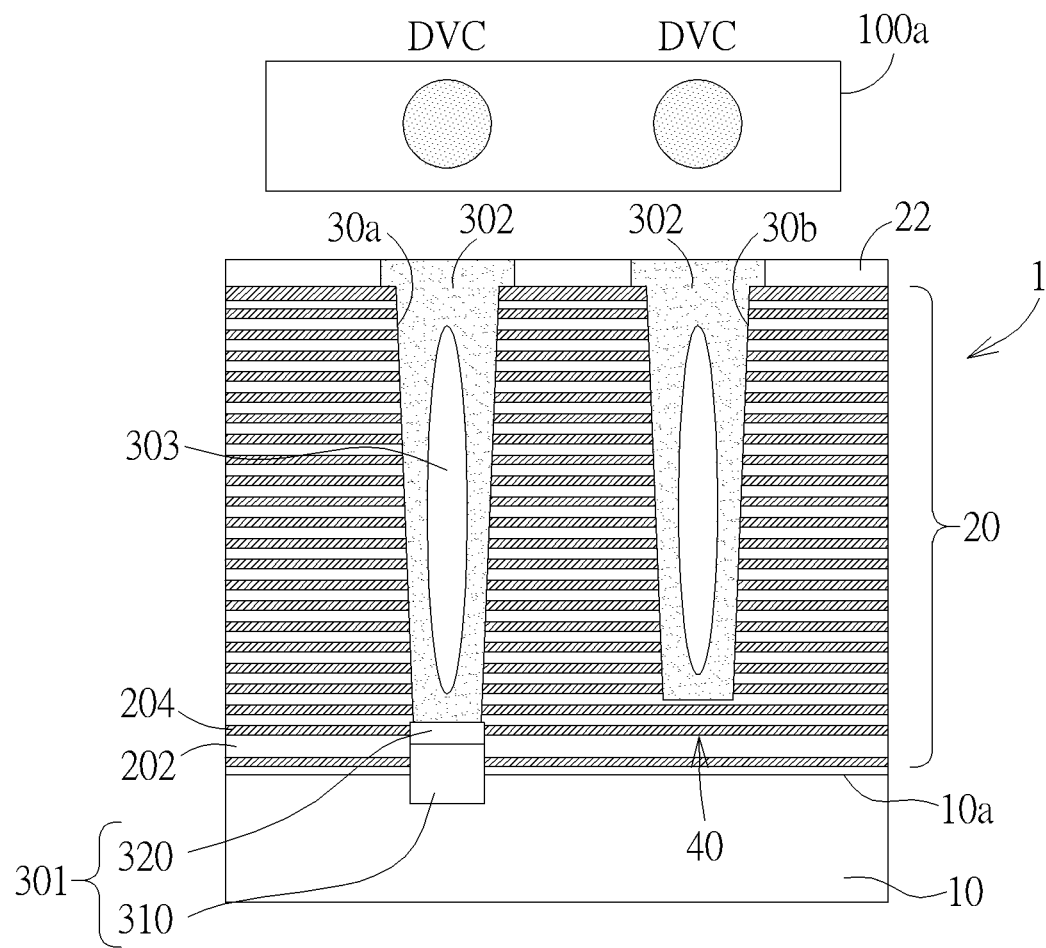
FIG. 1 is a schematic cross-sectional diagram showing the inspection result of a germane portion of a lower-stack fabricated on a substrate with an under-etch defect thereon utilizing conventional EBI method according to one embodiment of the present disclosure.

Embodiments of the present disclosure will be described with reference to the accompanying drawings.

DETAILED DESCRIPTION

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It is noted that references in the specification to "one embodiment," "an embodiment," "an exemplary embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment.

Further, when a particular feature, structure or characteristic is described in contact with an embodiment, it would be within the knowledge of a person skilled in the pertinent art to affect such feature, structure or characteristic in contact with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90° or at other orientations) and the spatially relative descriptors used herein may likewise be interpreted accordingly. The term "vertical" refers to the direction perpendicular to the surface of a semiconductor substrate, and the term "horizontal" refers to any direction that is parallel to the surface of that semiconductor substrate.

The present disclosure pertains to a method for detecting defects in deep (high-aspect-ratio) channel holes, via holes or trenches based on laser-enhanced electron tunneling effect. A substrate having thereon a film stack is provided. A first hole feature and a second hole feature are formed in the film stack. The first hole feature comprises a sacrificial oxide layer disposed at a bottom thereof, and the second hole feature comprises an under-etch defect at a bottom thereof. The sacrificial oxide layer has a thickness of less than 50 angstroms so that the electron tunneling can be induced across the sacrificial oxide layer. The substrate is subjected to a laser-enhanced electron beam inspection process. The substrate is scanned by an electron beam and illuminated by a laser beam, wherein the laser beam induces electron tunneling across the sacrificial protection layer, thereby capturing a bright voltage contrast (BVC) signal corresponding to the first hole feature, and detecting a dark voltage contrast (DVC) signal corresponding to the second hole feature.

FIG. 1 is a schematic cross-sectional diagram showing the inspection result corresponding to a germane portion of a bottom film stack fabricated on a substrate with an under-etch defect thereon utilizing conventional electron beam inspection (EBI) method according to one embodiment of the present disclosure. As shown in FIG. 1, a substrate 10 is provided. The substrate 10 may be a semiconductor substrate. According to one embodiment, for example, the substrate 10 may comprise a silicon substrate. According to some embodiments, for example, the substrate 10 may comprise a silicon-on-insulator (SOI) substrate, a SiGe substrate, a SiC substrate, or an epitaxial substrate, but is not limited thereto. A film stack 20 for the fabrication of a three-dimensional (3D) memory cell array such as a 3D NAND flash memory array may be formed on the substrate 10.

For example, the film stack 20 may comprise multiple layers of alternating oxide layer 202 and nitride layer 204. According to one embodiment, for example, the nitride layers 204 may be sacrificial silicon nitride layers and may be selectively removed in the later stage. After the nitride layers 204 are selectively removed, conductor layers, which may function as word line strips or gate electrodes, may be deposited in place of the nitride layers 204. According to one embodiment, for example, a hard mask layer 22 may be formed on the film stack 20. According to one embodiment, for example, the hard mask layer 22 may comprise a silicon oxide layer, but is not limited thereto.

It is to be understood that the substrate 10 may include integrated circuits fabricated thereon, such as driver circuits for the 3D memory cell array, which are not shown in the figures for the sake of simplicity. The alternating oxide layer 202 and nitride layer 204 may be formed by chemical vapor deposition (CVD) methods, atomic layer deposition (ALD) methods, or any suitable methods known in the art.

According to one embodiment, for example, multiple high-aspect-ratio deep features such as channel holes are formed in the film stack 20. For the sake of simplicity, only two exemplary channel holes 30a and 30b are shown in the figures. It is to be understood that an array of channel holes may be formed in the film stack 20. According to one embodiment, for example, the channel holes 30a and 30b are hollow, cylindrical deep holes penetrating through the film stack 20. According to one embodiment, for example, the channel holes 30a and 30b may be formed by using anisotropic dry etching methods such as reactive ion etching (RIE) methods, but not limited thereto.

According to one embodiment, for example, the channel hole 30a may comprise at least one end portion 301, which may extend substantially perpendicular to a major surface 10a of the substrate 10. The end portion 301 may comprise an epitaxial silicon layer 310 and a sacrificial protection layer 320 capping the epitaxial silicon layer 310. For example, the sacrificial protection layer 320 may be a thin silicon oxide layer having a thickness ranging between 5 angstroms and 100 angstroms. For example, the sacrificial protection layer 320 may have a thickness of about 45 angstroms.

According to one embodiment, in each of the channel holes 30a and 30b, a sacrificial polysilicon layer 302 may be deposited, functioning as the etch stop layer (ESL) for upper-stack channel holes' etching processes. According to one embodiment, due to the imperfect perpendicular profile that channel hole etching could get, the channel holes 30a and 30b are not completely filled with the sacrificial polysilicon layer 302 and a void (or a seam) 303 may be formed in channel holes 30a and 30b. The sacrificial protection layer 320 insulates the underlying epitaxial silicon layer 310 from the sacrificial polysilicon layer 302. According to one embodiment, after the deposition of the sacrificial polysilicon layer 302, a planarization process, including but not limited to chemical mechanical polishing (CMP), or dry etch, or wet etch process may be performed to remove excess polysilicon layer outside the channel holes 30a and 30b. The top surface of the hard mask layer 22 may be partially removed as well and exposed at this point.

According to one embodiment, for example, the exemplary channel hole 30b may have an under-etch defect 40 located at the bottom of the channel hole 30b. The voltage contrast (VC) image 100a, which is obtained by performing the conventional EBI method, shows that the conventional EBI tool captures dark VC (DVC) signals simultaneously for both the normal the channel hole 30a and the abnormally under-etched channel hole 30b. The under-etch defect 40 at the bottom of the channel hole 30b cannot be distinguished from the normal channel hole 30a because of the existence of the sacrificial protection layer 320. The present disclosure addresses this issue.

Figure 2:
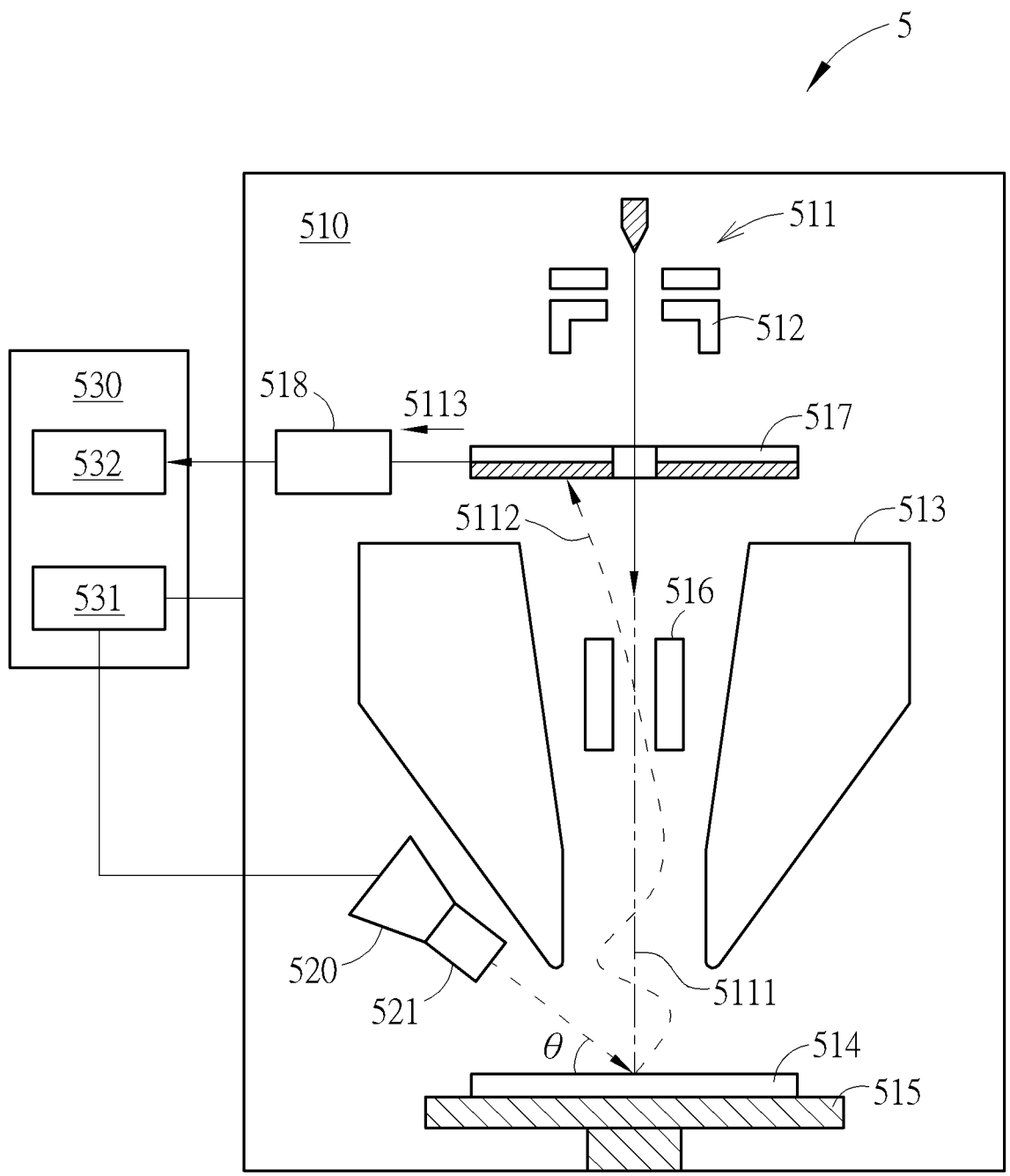
FIG. 2 is a schematic diagram showing an exemplary electron beam inspection system according to one embodiment of the present disclosure.

FIG. 2 is a schematic diagram showing an exemplary EBI system according to one embodiment of the present disclosure. It is to be understood that the configuration and elements in FIG. 2 are for illustration purposes only. As shown in FIG. 2, the exemplary EBI system 5 may comprise an electron beam imaging apparatus 510 for forming a voltage contrast image of a sample under inspection. For example, the electron beam imaging apparatus 510 may comprise an electron beam generator 511 for generating an electron beam in a vacuum environment. The electron beam passes through a condenser lens module 512, and an objective lens 513 to thereby form a condensed electron beam 5111 focused on a sample 514 secured on a stage 515. The condensed electron beam 5111 may be controlled by a deflection module 516 to scan the surface of the sample 514.

The electron beam 5111 is partially scattered back at the surface of the sample 514 along with the emitted secondary electrons 5112, which are collected by a sensor or detector module 517. The detector module 517 generates a detection signal 5113 accordingly. An image forming module 518 that is coupled to the detector module 517 receives the detection signal 5113 and accordingly forms an image such as voltage contrast image or grey level image.

According to one embodiment, for example, the electron beam imaging apparatus 510 further comprise a light source 520 for illuminating a laser beam 512 onto the surface of the sample 514. According to one embodiment, for example, a defect determination apparatus 530 may be provided. The defect determination apparatus 530 may be coupled to the electron beam imaging apparatus 510. The defect determination apparatus 530 may comprise a control module 531 and an image analysis module 532. The light source 520 may be coupled to the control module 531 such that the parameters of the laser beam 512 emanated from the light source 520 can be well controlled when the sample 514 is under inspection. The laser beam 521 may selectively impinge on the surface of the sample 514 at a pre-determined angle θ in accordance with the scanning of the condensed electron beam 5111. The optimal value of angle θ could be varying from 0° to 90° (excluding 0° and 90°). For example, the laser beam 521 may be selectively illuminated onto the surface of the sample 514 prior to or simultaneously with the scanning of the condensed electron beam 5111.

According to one embodiment, the laser beam 521 has energy that is higher than the band gap Eg of silicon (Eg=1.12 eV for single-crystal Si). According to one embodiment, for example, the laser beam 521 may have energy of about 2.0 eV. According to one embodiment, for example, the laser beam 521 may comprise photons with wavelengths shorter than 600 nm, which have energy more than the band gap energy Eg of silicon. The present disclosure provides an improved in-line defect inspection method that is capable of detecting under-etch defects in deep features like channel holes, via holes or trenches based on laser-enhanced electron tunneling effect.

Figure 3:
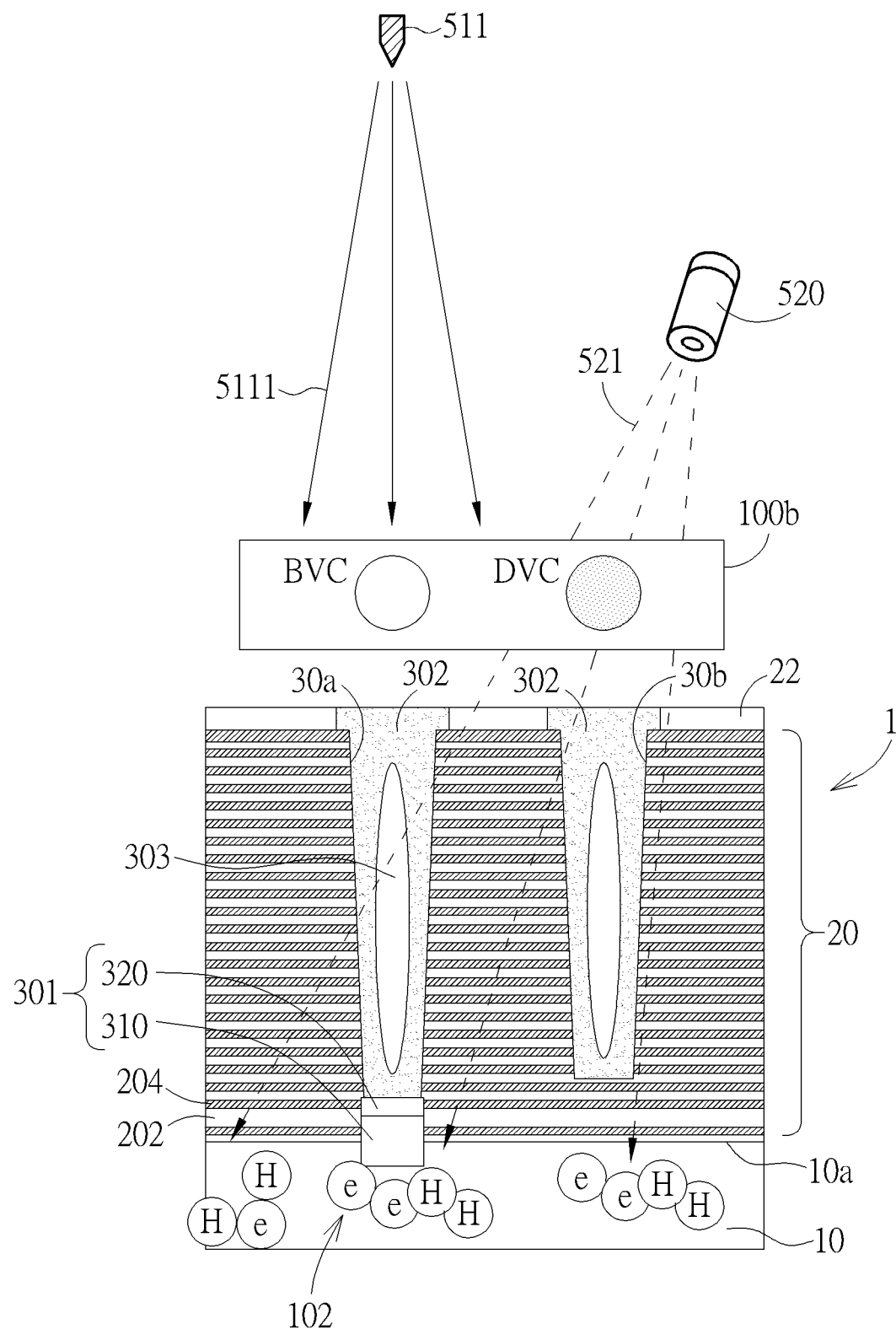
FIG. 3 is a schematic cross-sectional diagram showing the inspection result corresponding to a germane portion of a lower-stack fabricated on a substrate with an under-etch defect thereon utilizing the laser-enhanced EBI method according to one embodiment of the present disclosure.

Please also refer to FIG. 3. FIG. 3 is a schematic, cross-sectional diagram showing the inspection result corresponding to a germane portion of a bottom film stack fabricated on a substrate with an under-etch defect thereon utilizing the laser-enhanced EBI method according to one embodiment of the present disclosure. Like layers, regions or elements are designate by like numeral numbers.

As shown in FIG. 2 and FIG. 3, the laser beam 521 may be selectively illuminated onto the surface of the sample 514 prior to or simultaneously with the scanning of the condensed electron beam 5111. The laser beam 521 propagates along a predetermined direction, penetrates the film stack 20, and then reaches the surface of the substrate 10. The laser beam 521 provides photons with energy that is higher than the band gap of silicon of the sample 514, thereby producing electron-hole pairs 102 in the silicon substrate 10 and inducing electron-tunneling leakage current across the sacrificial protection layer 320 in the normal channel hole 30a. By inducing electron-tunneling leakage current across the sacrificial protection layer 320 in the normal channel hole 30a, a bright VC (BVC) signal can be detected by the electron beam imaging apparatus 510 in FIG. 2. The under-etched channel hole 30b can be detected by the electron beam imaging apparatus 510 as DVC signals, thereby forming a virtually distinguishable VC image 100b as depicted in FIG. 3.

It is advantageous to use the present disclosure because the EBI detection can be used to effectively distinguish under-etch defects in the abnormal channel holes from the normal channel holes in a real-time and in-line fashion. The disclosed embodiments are based on the photoelectric effect of the material and the quantum tunneling effect of the electron. Theoretical calculations show that the quantum tunneling effect of electrons is very obvious when the thickness of the insulating layer is less than 5 nm. Therefore, when the thickness of the sacrificial protection layer 320 is about 4.5 nm (45 angstroms), there is EBI detection signal. The laser has a wavelength of 600 nm and can meet the energy requirements of Si electron excitation. By adjusting the angle of the laser beam, the electrons in Si absorb photon energy and become excited electrons. The presence of a large amount of electrons increases the number of tunneling electrons, enabling EBI to distinguish between normal channel holes and abnormal defects.

The disclosed embodiments provide effective EBI in-line detection without the need of removing the sacrificial oxide layer. The disclosed embodiments also provide advantages of early capture of under etch defects in deep hole by 3 weeks, high accuracy, and non-destructive inspection. The semiconductor structure shown in FIG. 1 and FIG. 3 are for illustration purposes only. It is to be understood that the present disclosure may be applicable to other EBI defect inspection cases, for example, high-aspect ratio contact holes or trenches.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A defect inspection method, comprising:
providing a substrate having thereon a film stack, a first deep feature in the film stack, and a second deep feature in the film stack, wherein the first deep feature comprises a sacrificial protection layer disposed at a bottom thereof, and the second deep feature comprises an under-etch defect disposed at a bottom thereof; and
subjecting the substrate to a laser-enhanced electron beam inspection process, wherein the substrate is scanned by an electron beam and illuminated by a laser beam, wherein the laser beam induces electron tunneling across the sacrificial protection layer during the laser-enhanced electron beam inspection process, thereby capturing a bright voltage contrast (BVC) signal corresponding to the first deep feature, and detecting a dark voltage contrast (DVC) signal corresponding to the second deep feature.

2. The defect inspection method according to claim 1, wherein the sacrificial protection layer is a silicon oxide layer and has a thickness ranging between 5 angstroms and 100 angstroms.

3. The defect inspection method according to claim 1, wherein the substrate is a semiconductor substrate.

4. The defect inspection method according to claim 1, wherein the first deep feature and the second deep feature are hollow holes penetrating through the film stack.

5. The defect inspection method according to claim 1, wherein the film stack comprise multiple layers of alternating dielectric layer and conductive layer, or, multiple layers of alternating dielectric layer and metal gateline replacement sacrificial layer.

6. The defect inspection method according to claim 1, wherein the first deep feature comprises one end portion extending perpendicular to a major surface of the substrate, and wherein the end portion comprises a silicon layer and the sacrificial protection layer capping the epitaxial silicon layer.

7. The defect inspection method according to claim 1, wherein in each of the first and second deep features, a sacrificial layer is deposited, and wherein the first and second deep features are not completely filled with the sacrificial layer and a void is formed in each of the first and second deep features.

8. The defect inspection method according to claim 7, wherein the sacrificial protection layer insulates the epitaxial silicon layer from the sacrificial layer.

9. The defect inspection method according to claim 1, wherein the laser beam has energy that is higher than band gap of silicon.

10. The defect inspection method according to claim 1, wherein the laser beam has energy of about 2.0 eV.

* * * * *